United States Patent
Li et al.

(10) Patent No.: US 8,296,619 B2
(45) Date of Patent: Oct. 23, 2012

(54) METHOD AND APPARATUS FOR INDICATING A TEMPORARY BLOCK FLOW TO WHICH A PIGGYBACKED ACK/NACK FIELD IS ADDRESSED

(75) Inventors: Yan Li, Center Valley, PA (US); Stephen G. Dick, Nesconset, NY (US); Prabhakar R. Chitrapu, Blue Bell, PA (US); Marian Rudolf, Vitre (FR); Behrouz Aghili, Melville, NY (US); Khushali N. Manseta, Yardley, PA (US)

(73) Assignee: InterDigital Technology Corporation, Wilmington, DE (US)

(*) Notice: Subject to any disclaimer, the term of this patent is extended or adjusted under 35 U.S.C. 154(b) by 981 days.

(21) Appl. No.: 12/106,138

(22) Filed: Apr. 18, 2008

(65) Prior Publication Data

US 2008/0274698 A1 Nov. 6, 2008

Related U.S. Application Data

(60) Provisional application No. 60/913,179, filed on Apr. 20, 2007, provisional application No. 60/974,293, filed on Sep. 21, 2007, provisional application No. 60/981,980, filed on Oct. 23, 2007.

(51) Int. Cl.
*H04J 7/02* (2006.01)
*H04J 3/24* (2006.01)

(52) U.S. Cl. ........ 714/758; 370/346; 370/449; 370/479; 370/499; 370/204

(58) Field of Classification Search .................. 370/204, 370/474, 449; 714/758
See application file for complete search history.

(56) References Cited

U.S. PATENT DOCUMENTS 5,751,741 A * 5/1998 Voith et al. .................... 714/758
(Continued)

FOREIGN PATENT DOCUMENTS

EP 1 376 950 1/2004
(Continued)

OTHER PUBLICATIONS

Third Generation Partnership Project, "Technical Specification Group GSM/EDGE Radio Access Network; Channel coding (Release 7)", 3GPP TS 45.003 V7.4.0 (Feb. 2008).

(Continued)

*Primary Examiner* — Scott Baderman
*Assistant Examiner* — Jeison C Arcos
(74) *Attorney, Agent, or Firm* — Volpe and Koenig, P.C.

(57) ABSTRACT

A method and an apparatus for indicating a temporary block flow (TBF) to which a piggybacked acknowledgement/non-acknowledgement (PAN) field is addressed. A method and apparatus of performing receive processing to reduce the probability of false acceptance of erroneous PANs are also disclosed. A transmit station generates a PAN check sequence (PCS) and performs a channel coding on a PAN field and the PCS. The transmit station scrambles the encoded bits of the PAN field and the PCS with a TBF-specific scrambling code. Because of the scrambling, the PCS decoding at a receive station will pass if the data block is received by an intended receive station, while the PCS decoding will fail if received by a non-intended receive station. Alternatively, the scrambling may be performed before the channel coding. Alternatively, the transmit station may combine the PAN field and a temporary flow identity (TFI) to generate a PCS.

34 Claims, 4 Drawing Sheets

U.S. PATENT DOCUMENTS

| | | | |
|---|---|---|---|
| 6,532,211 B1 * | 3/2003 | Rathonyi et al. | 370/230 |
| 7,227,839 B2 | 6/2007 | Forssell et al. | |
| 7,417,960 B2 | 8/2008 | Sakusabe | |
| 2004/0058687 A1 | 3/2004 | Kim et al. | |
| 2008/0002565 A1 * | 1/2008 | Spencer | 370/204 |
| 2008/0056303 A1 * | 3/2008 | Sebire et al. | 370/474 |
| 2008/0274698 A1 * | 11/2008 | Li et al. | 455/63.1 |
| 2008/0279211 A1 * | 11/2008 | Chitrapu et al. | 370/449 |

FOREIGN PATENT DOCUMENTS

| | | |
|---|---|---|
| EP | 1 780 926 | 5/2007 |
| EP | 1780926 A1 * | 5/2007 |
| GB | 2 379 144 | 2/2003 |
| JP | 2006-287980 | 10/2006 |
| WO | 00/28763 | 5/2000 |

OTHER PUBLICATIONS

Third Generation Partnership Project, "Technical Specification Group Radio Access Network; Multiplexing and channel coding (FDD) (Release 5)," 3GPP TS 25.212 V5.10.0 (Jun. 2005).

Third Generation Partnership Project, "Technical Specification Group Radio Access Network; Multiplexing and channel coding (FDD) (Release 7)," 3GPP TS 25.212 V7.4.0 (Mar. 2007).

Third Generation Partnership Project, "Technical Specification Group Radio Access Network; Multiplexing and channel coding (FDD) (Release 7)," 3GPP TS 25.212 V7.7.0 (Dec. 2007).

Third Generation Partnership Project, "Technical Specification Group Radio Access Network; Multiplexing and channel coding (FDD) (Release 8)," 3GPP TS 25.212 V8.1.0 (Mar. 2008).

Rohde & Schwarz et al., "Text Case 34.x: Insufficient Handling Of SMS Timer TC1M", Change Request, 51.010-1 CR 3764, Current Version 7.4.0, 3GPP TSG-GERAN Meeting #33, GP-070078, (Seoul, Korea, Feb. 13-15, 2007).

Third Generation Partnership Project, " Technical Specification Group GSM/EDGE Radio Access Network; Feasibility study for evolved GSM/EDGE Radio Access Network (GERAN) (Release 7)," 3GPP TR 45.912 V2.0.1 (Sep. 2006).

Third Generation Partnership Project, "Technical Specification Group GSM/EDGE Radio Access Network; Feasibility study for evolved GSM/EDGE Radio Access Network (GERAN) (Release 7)", 3GPP TR 45.912 V7.0.0 (Oct. 2006).

Third Generation Partnership Project, "Technical Specification Group GSM/EDGE Radio Access Network; Feasibility study for evolved GSM/EDGE Radio Access Network (GERAN) (Release 7)", 3GPP TR 45.912 V7.2.0 (Feb. 2007).

Third Generation Partnership Project, "Technical Specification Group GSM/EDGE Radio Access Network; Channel coding (Release 7)", 3GPP TS 45.003 V7.1.0 (Mar. 2007).

Third Generation Partnership Project, "Technical Specification Group GSM/EDGE Radio Access Network; Channel Coding (Relaese 7)", 3GPP TS 45.003 V7.4.0 (Feb. 2008).

Third Generation Partnership Project, "Technical Specification Group GSM/EDGE Radio Access Network; Multiplexing and channel coding (FDD) (Release 5)," .GPP TS 25.212 V5.10.0 (Jun. 2005).

Third Generation Partnership Project, "Technical Specification Group GSM/EDGE Radio Access Network; Multiplexing and channel coding (FDD) (Release 7)," 3GPP TS25.212 V7.4.0 (Mar. 2007).

Third Generation Partnership Project, "Technical Specification Group GSM/EDGE Radio Access Network; Multiplexing and channel coding (FDD) (Release 7)," 3GPP TS 25.212 V7.7.0 (Dec. 2007).

Third Generation Partnership Project, "Technical Specification Group GSM/EDGE Radio Access Network; Multiplexing and channel coding (FDD) (Release 8)," 3GPP TS 25.212 V8.1.0 (Mar. 2008).

Third Generation Partnership Project, "Technical Specification Group GSM/EDGE Radio Access Network; General Packet Radio Service (GPRS); Mobile Station (MS)—Base Station System (BSS) interface; Radio Link Control/Medium Access Control (RLC/MAC) protocol (Release 7)," 3GPP TS 44.060 V7.8.0 (Mar. 2007).

Third Generation Partnership Project, "Technical Specification Group GSM/EDGE Radio Access Network; General Packet Radio Service (GPRS); Mobile Station (MS)—Base Station System (BSS) interface; Radio Link Control/Medium Access Control (RLC/MAC) protocol (Release 7)," 3GPP TS 44.060 V7.12.0 (Mar. 2008).

* cited by examiner

METHOD AND APPARATUS FOR INDICATING A TEMPORARY BLOCK FLOW TO WHICH A PIGGYBACKED ACK/NACK FIELD IS ADDRESSED

CROSS REFERENCE TO RELATED APPLICATIONS

This application claims the benefit of U.S. provisional application Nos. 60/913,179 filed Apr. 20, 2007, 60/974,293 filed Sep. 21, 2007, and 60/981,980 filed Oct. 23, 2007, which are incorporated by reference as if fully set forth.

FIELD OF INVENTION

This application is related to wireless communications.

BACKGROUND

Latency reduction is one of the considerations in a GSM/EDGE radio access network (GERAN). Two techniques have been proposed for latency reduction: reduced transmission time interval (RTTI) and fast acknowledgement/non-acknowledgement (ACK/NACK) reporting (FANR).

Conventionally, an ACK/NACK report is sent in an explicit message, also referred to as a radio link control/medium access control (RLC/MAC) control block. The ACK/NACK report is addressed to a particular radio resource, called a temporary block flow (TBF).

A TBF is a temporal connection between a mobile station and a network to support a uni-directional transfer of data. A TBF is temporary and maintained only for the duration of the data transfer. Each TBF is assigned a temporary flow identity (TFI) by the network. The TFI is unique among concurrent TBFs in each direction and is used instead of mobile station identity in the RLC/MAC layer. The same TFI is included in every RLC header belonging to a particular TBF.

It has been proposed to send the ACK/NACK report for a certain TBF as a "piggyback" on an RLC/MAC data block that may be addressed to another TBF. The field that carries the ACK/NACK report is referred to as a piggybacked ACK/NACK (PAN) field.

Since the PAN field is included in a data block that may be addressed to a different TBF, it is necessary to identify to which TBF the PAN field is addressed. Various proposals have been made to identify the correct TBF in the PAN field, including using a TFI or an uplink (UL) state flag (USF). During establishment of the uplink TBF, a USF is assigned to each mobile station. The USF is used by the network to indicate which mobile terminal is allowed to transmit in the following uplink radio block.

In either case, some number of bits, (typically ranging from three to five), should be dedicated to the TBF identity in the PAN field. It would be desirable to have an efficient method of sending the TBF identity in the PAN field such that no dedicated bits are needed to identify the TBF.

SUMMARY

A method and an apparatus for sending and receiving a PAN are disclosed. A method and apparatus for indicating a TBF to which a PAN field is addressed are also disclosed. a receiving process which greatly reduces probability of false acceptance of erroneously received PANs while not reducing probability of accepting correctly received PANs is also disclosed. A transmit station generates a PAN check sequence (PCS) and performs a channel coding on the PAN field and the PCS. In a second variant the transmit station scrambles the encoded bits of the PAN field and the PCS with a TBF-specific scrambling code. Because the PAN field and the PCS are scrambled with a TBF-specific scrambling code, the PCS decoding at a receive station will pass if the data block is received by an intended receive station, while the PCS decoding will fail if received by a non-intended receive station. In a third variant, the scrambling may be performed before the channel coding. For all three variants the transmit station may combine the PAN field and a TFI to generate the PCS. In addition, advanced receiver techniques are defined which significantly improve the reliability of the processing. For a specified format for encoding the PAN field, the PCS and the TBF, the use of forward error correction filtering greatly reduces the probability of false acceptance of an invalid PAN while not reducing the probability of acceptance of correctly received PAN transmissions. These improvements are achievable independent of whether or not the scrambling code is applied to the PAN and also independent of whether or not the PCS is dependent or independent of the TBF.

BRIEF DESCRIPTION OF THE DRAWINGS

A more detailed understanding may be had from the following description, given by way of example in conjunction with the accompanying drawings wherein.

DETAILED DESCRIPTION

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of user device capable of operating in a wireless environment. When referred to hereafter, the terminology "base station" includes but is not limited to a Node-B, a site controller, an access point (AP), or any other type of interfacing device capable of operating in a wireless environment.

Figures 1, 2:
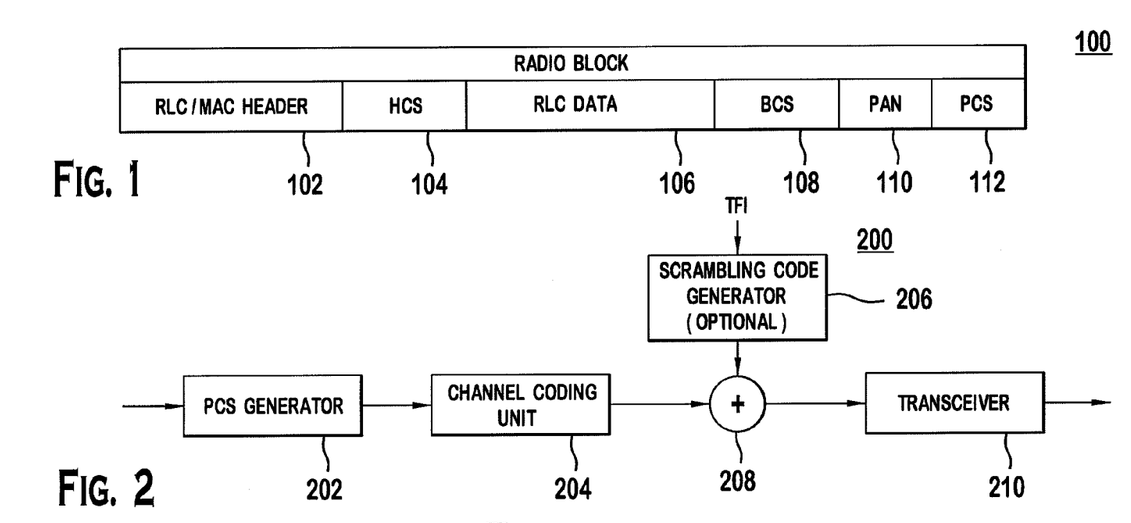
FIG. 1 shows an example radio block.
FIG. 2 is a block diagram of an example transmit station in accordance with one embodiment.

FIG. 1 shows an example radio block 100. The radio block 100 for data transfer includes one RLC/MAC header 102, a header check sequence (HCS) 104, one or more RLC data block(s) 106, a block check sequence (BCS) 108, a PAN field 110, and a PCS 112. The RLC/MAC header 102, the RLC data block(s) 106 and the PAN field 110 are coded separately for error detection and correction, and a separate checksum, (e.g., a cyclic redundancy check (CRC) checksum), is attached to each of them. The RLC/MAC header 102 contains a control field indicating whether a PAN field 110 is included or not in the radio block 100. The HCS 104 is used for error detection of the RLC/MAC header 102. The BCS 108 is used for error detection of the RLC data block 106. A separate BCS may be included for each RLC data block. The PAN field 110 contains piggy-backed ACK/NACK information sent in one direction to provide acknowledgement for a TBF in the other direction. The PCS 112 is used for error detection of the PAN field 110.

FIG. 2 is a block diagram of an example transmit station 200 in accordance with one embodiment. The transmit station 200 may be a WTRU or a base station. The transmit station 200 includes a PCS generator 202, a channel coding unit 204, a scrambling code generator 206 (optional), an adder 208 (optional), and a transceiver 210. A PAN field is encoded separately from the header and the payload of the RLC data. The PCS generator 202 computes a PCS with the PAN field. For example, the PAN field may be 20 bits and the PCS may be 10 bits. The channel coding unit 204 performs channel coding with the PAN field and the PCS. For example, the channel coding may be ⅓ forward error correction (FEC) coding to generate 90 bits of output from the 30 bits of PAN field and the PCS. The encoded bits may be punctured to 80 bits.

The scrambling code generator 206 may generate a TBF-specific scrambling code based on the TFI. The length of the scrambling code may be equal to the number of the channel coded bits. In the above example, the scrambling code may be 80-bits long. A unique scrambling code is generated for each value of TBF. The scrambling codes may be orthogonal to each other. The scrambling codes are designed to have large minimum distances.

The channel coded bits may then be scrambled, (i.e., modulo 2 added by the adder 208), with the TBF-specific scrambling code. A data block including the scrambled encoded bits is transmitted by the transceiver 210.

Figure 3:
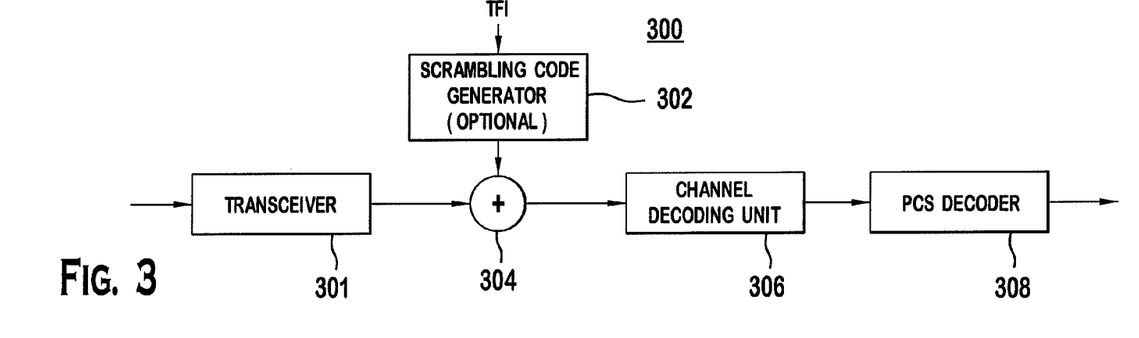
FIG. 3 is a block diagram of an example receive station in accordance with one embodiment.

FIG. 3 is a block diagram of an example receive station 300 in accordance with one embodiment. The receive station 300 may be a WTRU or a base station. The receive station 300 includes a transceiver 301, a scrambling code generator 302 (optional), an adder 304 (optional), a channel decoding unit 306, and a PCS decoder 308. The transceiver 301 receives a data block including scrambled coded bits of a PAN field and a PCS. The scrambling code generator 302 generates a TBF-specific scrambling code based on the TFI. The received scrambled coded bits of the PAN field and the PCS are descrambled, (i.e., modulo-2 added to the TBF-specific scrambling code by the adder 304). The channel decoding unit 306 decodes the descrambled coded bits to obtain the PAN field and the PCS. The PCS decoder 308, (e.g., CRC decoder), then performs PCS checking with the received PAN field and PCS. If the PCS checking passes, the received PAN field is accepted, but if the PCS checking fails, the received PAN field is rejected. Because the PAN field and the PCS are scrambled with a TBF-specific scrambling code, the PCS decoding will pass if the data block is received by an intended receive station, while the PCS decoding will fail if the data block is received by a non-intended receive station.

Figures 4, 5:
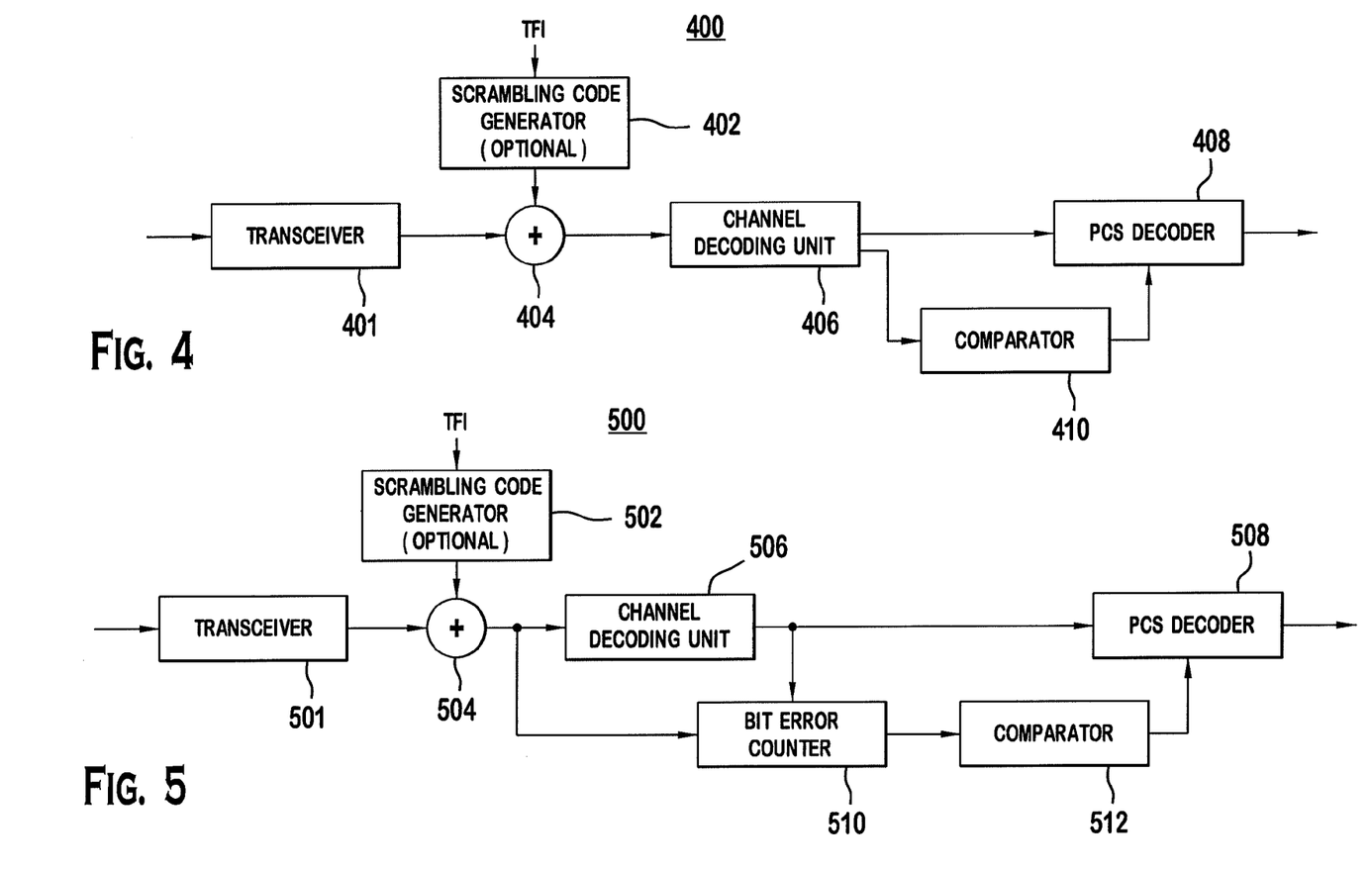
FIG. 4 shows a receive station in accordance with another embodiment.
FIG. 5 shows a receive station in accordance with another embodiment.

FIG. 4 shows a receive station 400 in accordance with another embodiment. The receive station 400 includes a transceiver 401, a scrambling code generator 402 (optional), an adder 404 (optional), a channel decoding unit 406, a PCS decoder 408, and a comparator 410. The embodiment disclosed herein may be implemented with or without scrambling. The transceiver 401 receives a data block including (scrambled or unscrambled) coded bits of a PAN field and a PCS. The scrambling code generator 402 may generate a TBF-specific scrambling code based on the TFI (if applicable). The received coded bits of the PAN field and the PCS may be descrambled, (i.e., modulo-2 added to the TBF-specific scrambling code by the adder 404) (if applicable). The channel decoding unit 406 decodes the coded bits to obtain the PAN field and the PCS.

In order to achieve better performance of PAN field error detection than the conventional CRC-based error detection mechanism, the receive station 400 may make use of soft metrics to estimate how well the channel decoding performs. The comparator 410 may compare a soft metric computed by the channel decoding unit 406 to a threshold. If the channel link quality is evaluated to be bad based on the soft metrics, the receive station 400 may reject the received PAN field before the PCS decoding.

For example, for Viterbi-type FEC decoders, the soft metric may be the best survivor path metric, (which measures the error between the received sequence and the estimated optimal path). The best survivor path metric, (either highest or lowest depending on the decoding algorithm), is compared to the threshold and the PAN field may be discarded based on the comparison result.

Alternatively, the soft metric may be the difference between the best and the second best survivor path metrics, or the difference between the best and the worst survivor path metrics. If the received signal is highly corrupted by the channel, the surviving paths are likely to be close to each other and the dynamic range of the path metric differences is likely to be small. On the other hand, the metric is likely to be larger if the signal corruption by the channel is marginal. The difference is compared to a threshold and the PAN field may be discarded if the difference is less than, (or greater than depending on the decoding algorithm), the threshold.

The PCS decoder 408, (e.g., CRC decoder), then performs PCS checking with the received PAN field and PCS. If the PCS checking passes, the received PAN field is accepted, but if the PCS checking fails, the received PAN field is rejected.

FIG. 5 shows a receive station 500 in accordance with another embodiment. The receive station 500 includes a transceiver 501, a scrambling code generator 502 (optional), an adder 504 (optional), a channel decoding unit 506, a PCS decoder 508, a bit error counter 510, and a comparator 512. The embodiment disclosed herein may be implemented with or without scrambling. The transceiver 501 receives a data block including (scrambled or unscrambled) coded bits of a PAN field and a PCS. The scrambling code generator 502 may generate a TBF-specific scrambling code based on the TFI (if applicable). The received coded bits of the PAN field and the PCS may be descrambled, (i.e., modulo-2 added to the TBF-specific scrambling code by the adder 504) (if applicable). The channel decoding unit 506 decodes the coded bits to obtain the PAN field and the PCS.

The bit error counter 510 calculates the number of bit errors. The comparator 512 compares the calculated bit error counts to a threshold. The bit error counts may be calculated by comparing re-encoded PAN field and PCS bits, (i.e., re-performing FEC encoding on the FEC decoded PAN field and PCS bits), with the input of the channel decoder 506, (i.e., hard decision or soft decision bits (after descrambling if applicable)). The received PAN field is rejected if the computed bit error counts are greater than the threshold.

Figure 6:
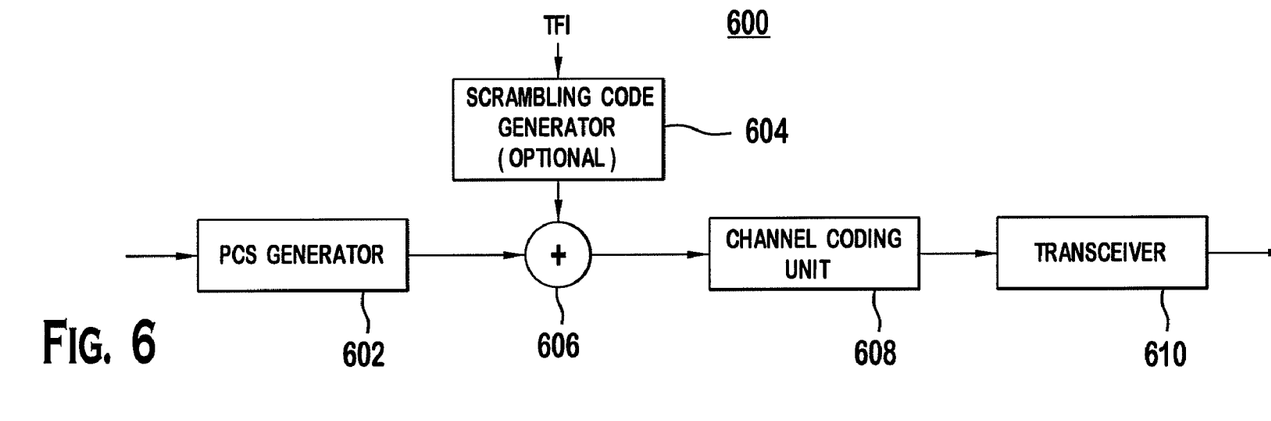
FIG. 6 is a block diagram of an example transmit station in accordance with another embodiment.

FIG. 6 is a block diagram of an example transmit station 600 in accordance with another embodiment. In this embodiment, the scrambling may be performed before channel coding. The transmit station 600 includes a PCS generator 602, a scrambling code generator 604 (optional), an adder 606 (optional), a channel coding unit 608, and a transceiver 610. The PCS generator 602 generates a PCS with the PAN field. The scrambling code generator 604 generates a TBF-specific scrambling code based on the TFI. For example, if the PAN field is twenty bits and the PCS is 10 bits, the TBF-specific scrambling code of 30 bits may be generated to scramble the PAN field and the PCS. Any conventional coding may be used to map a 5-bit TFI into a thirty bit scrambling code. A good set of codes will have the largest possible minimum distance and the lowest frequency of occurrence of this minimum value. Under these conditions, the probability of erroneously accepting a PAN field addressed to another station will be minimized.

The scrambling code is modulo-2 added to the PAN field and the PCS bits by the adder 606. The scrambled PAN field and PCS bits are channel coded by the channel coding unit 608. The channel coded bits are then transmitted by the transceiver 610. This embodiment has an advantage that the scrambling sequence length is smaller and that channel errors are corrected by the channel coding, (i.e., FEC).

Figure 7:
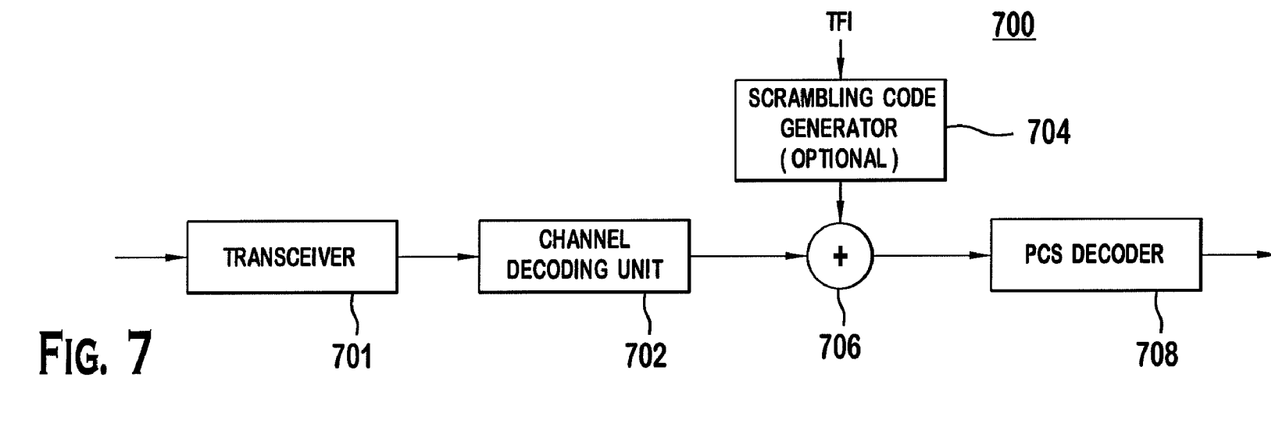
FIG. 7 is a block diagram of an example receive station that corresponds to the transmit station of FIG. 6.

FIG. 7 is a block diagram of an example receive station 700 that corresponds to the transmit station of FIG. 6. The receive station 700 includes a transceiver 701, a channel decoder 702, a scrambling code generator 704 (optional), an adder 706 (optional), and a PCS decoder 708. The transceiver 701 receives a data block including coded bits generated from the scrambled PAN field and PCS. The channel decoder 702 decodes the channel coded bits to recover the scrambled PAN field and PCS. The scrambling code generator 704 generates a TBF-specific scrambling code based on the TFI. The scrambling code is modulo-2 added to the scrambled PAN field and PCS by the adder 706 to recover the unscrambled PAN field and PCS. The PCS decoder 708 then performs PCS checking with the unscrambled PAN field and PCS. If the PCS checking passes, the received PAN field is accepted, but if the PCS checking fails, the received PAN field is rejected.

The receive station 700 may optionally include a comparator for comparing soft metrics with a threshold, similar to the receive station 400 in FIG. 4, and may optionally include a bit error counter and a comparator for calculating and comparing a bit error count to a threshold, similar to the receive station 500 in FIG. 5. It should be noted that the scrambling scheme is optional and the advanced receiver technique (soft metric receive processing) may be implemented independent of the scrambling feature.

In accordance with another embodiment, the TFI, (e.g., 5 bits long), may be combined with the PAN field, and the PCS may be calculated with the combined PAN field and TFI. After computing the PCS, the TFI is removed and the PAN field and the calculated PCS are channel coded and transmitted. The receive station inserts its own TFI into the decoded bits after channel decoding. The receive station then performs PCS check. An intended receive station will pass the PCS check, while a non-intended receive station will introduce a burst of errors of five (5) or fewer bits by inserting its TFI. Since 10-bit hh is capable of detecting all bursts of errors less than 11 bits, the non-intended receive station will fail the CRC check and reject the PAN message with very high probability.

The schemes of using soft metrics disclosed above are based on an implicit assumption that the FEC decoder produces hard decision outputs, (e.g., quantized binary outputs). The schemes can be extended to the case when the FEC decoder produces soft decision outputs. For example, the FEC decoder may produce a bit error probability (BEP), which is an estimate of the reliability of the decoded bits. Such a soft metric may be directly used to assist the PAN detection process, as described above.

The receiver embodiments of using soft metrics from the decoder as described with reference to FIGS. 4 and 5 are applicable to any transmitter-receiver implementations, and are not limited to the transmitter-receiver implementation disclosed herein. For example, the soft metric receive processing (the receive processing scheme disclosed with reference to FIGS. 4 and 5) may be applied to the case where the transmitter sends PAN fields wherein a PCS is masked with a TFI, as disclosed in U.S. patent application Ser. No. 12/056,433 entitled "METHOD AND APPARATUS FOR INDICATING A TEMPORARY BLOCK FLOW TO WHICH A PIGGYBACKED ACKNOWLEDGEMENT/NON-ACKNOWLEDGEMENT FIELD IS ADDRESSED."

Figure 8:
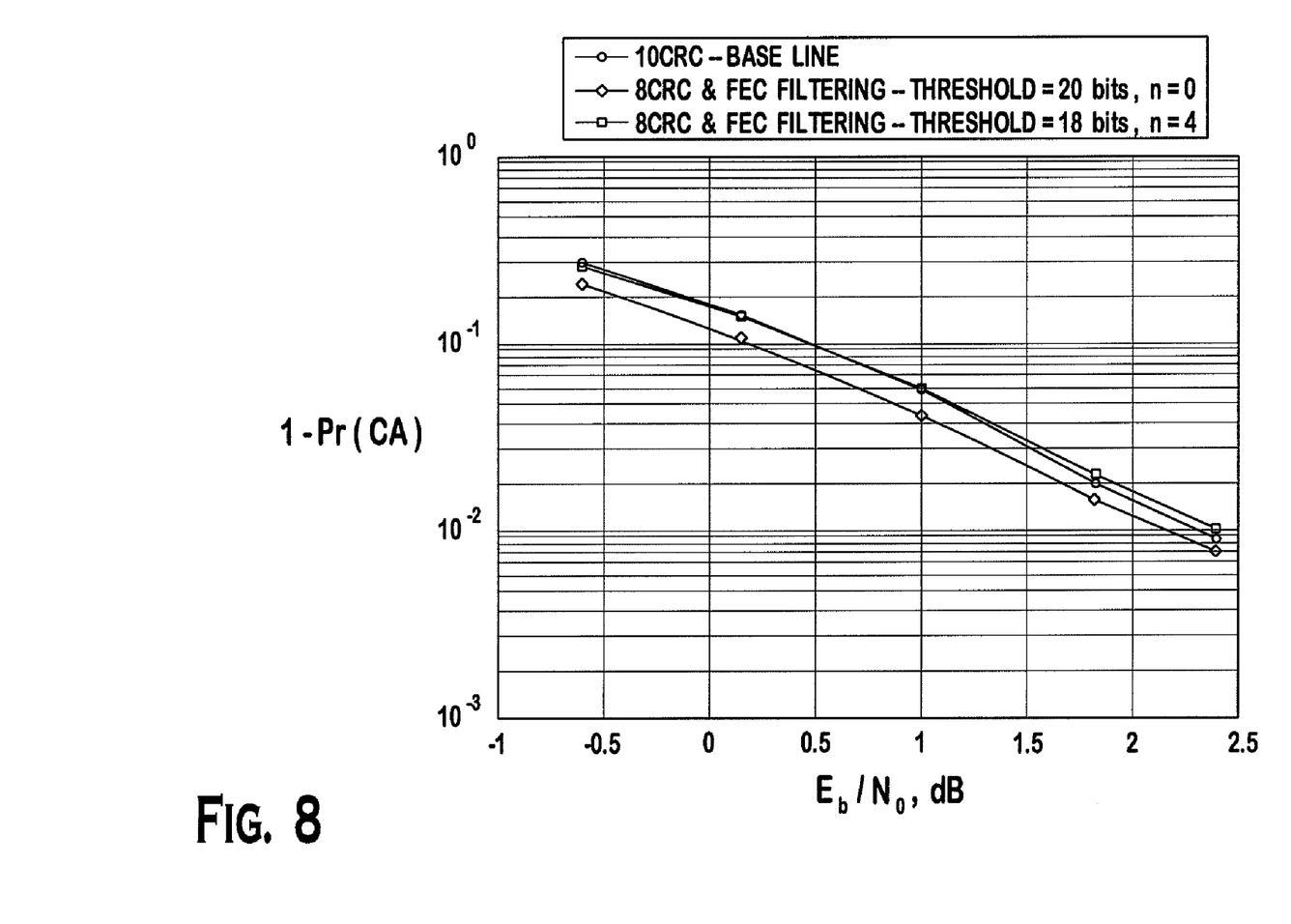
FIG. 8 shows simulation results comparing the advanced receive processing with the conventional receive processing.

FIG. 8 shows simulation results comparing the soft metric receive processing with the conventional receive processing. In the simulation, the scrambling is turned off and CRC TFI masking and the soft metric receive processing are implemented. The estimated raw bit errors are used as the soft metric. Three cases are considered as follows:

(A) 20 bit Payload+10 bit CRC→80 raw bits (Baseline);
(B) 20 bit Payload+8 bit CRC→80 raw bits; and
(C) 20 bit Payload+8 bit CRC 4 (80-n) raw bits, n=1, 2, ..., 5.

For the cases (B) and (C), the soft metric receive processing is applied.

Two performance metrics are measured as follows:
(1) 1-Pr(Correct Acceptance) for the intended WTRU versus SNRs from −0.6 dB to 2.4 dB; and
(2) Pr(False Acceptance|Erraneous Decoded Block) for both intended and unintended WTRUs for −0.6 dB.

At −0.6 dB, the thresholds for soft metric filtering were chosen to have the same or similar Pr(False Acceptance|Erraneous Decoded Block) for all three cases as shown in Table 1.

TABLE 1

|  | (A) | (B) threshold = 20, n = 0 | (C) threshold = 18, n = 4 |
|---|---|---|---|
| Pr(False Acceptance\| Erraneous Decoded Block | $1.01 \times 10^{-3}$ | $1.08 \times 10^{-3}$ | $1.00 \times 10^{-3}$ |

As shown in FIG. 8, the soft metric receive processing may increase the probability of correct acceptances for the intended users by about 0.25 dB, or reduce the PAN raw bits by 4 bits, with the same or similar probability of false acceptance as the baseline approach.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) or Ultra Wide Band (UWB) module.

What is claimed is:

1. A method for indicating a temporary block flow (TBF) to which a piggybacked acknowledgement/non-acknowledgement (PAN) field is addressed, the method comprising:
   generating a PAN check sequence (PCS) for the PAN field;
   performing forward error correction (FEC) encoding on the PAN field and the PCS to generate coded bits;
   scrambling the coded bits with a TBF-specific scrambling code; and
   sending a data block including the scrambled coded bits.

2. A method for indicating a temporary block flow (TBF) to which a piggybacked acknowledgement/non-acknowledgement (PAN) field is addressed, the method comprising:
   generating a PAN check sequence (PCS) for the PAN field;
   scrambling the PAN field and the PCS with a TBF-specific scrambling code;
   performing forward error correction (FEC) encoding on the scrambled PAN field and PCS to generate coded bits; and
   sending a data block including the coded bits.

3. A method for indicating a temporary block flow (TBF) to which a piggybacked acknowledgement/non-acknowledgement (PAN) field is addressed, the method comprising:
   combining the PAN field and a temporary flow identity (TFI);
   generating a PAN check sequence (PCS) with the combined PAN field and TFI;
   removing the TFI;
   performing forward error correction (FEC) encoding on the PAN field and the PCS to generate coded bits; and
   sending a data block including the coded bits.

4. A method for processing a piggybacked acknowledgement/non-acknowledgement (PAN) field, the method comprising:
   receiving a data block including coded bits of a PAN field and a PAN check sequence (PCS);
   decoding the coded bits of the PAN field and the PCS;
   performing a PCS check with the PAN field and the PCS;
   performing a soft metric test by comparing a soft metric computed during the decoding with a threshold; and
   accepting the PAN field on a condition that both the PCS check and the soft metric test pass.

5. The method of claim 4 wherein the soft metric is a best survivor path metric in Viterbi-type forward error correction decoding.

6. The method of claim 4 wherein the soft metric is a difference between a best survivor path metric and a second best survivor path metric in Viterbi-type forward error correction decoding.

7. The method of claim 4 further comprising:
   computing a bit error count;
   comparing the bit error count with a threshold; and
   accepting the PAN field if the bit error count is smaller than the threshold and rejecting the PAN field if the bit error count is not smaller than the threshold.

8. A method for processing a piggybacked acknowledgement/non-acknowledgement (PAN) field, the method comprising:
   receiving a data block including coded bits of scrambled PAN field and PAN check sequence (PCS);
   decoding the coded bits to obtain scrambled PAN field and PCS;
   descrambling the scrambled PAN field and PCS with a temporary block flow (TBF)-specific scrambling code; and
   performing a PCS check with the PAN field and the PCS.

9. The method of claim 8 further comprising:
   comparing a soft metric computed during the decoding with a threshold; and
   accepting the PAN field based on a comparison result.

10. The method of claim 9 wherein the soft metric is a best survivor path metric in Viterbi-type forward error correction decoding.

11. The method of claim 9 wherein the soft metric is a difference between a best survivor path metric and a second best survivor path metric in Viterbi-type forward error correction decoding.

12. The method of claim 8 further comprising:
   computing a bit error count;
   comparing the bit error count with a threshold; and
   accepting the PAN field if the bit error count is smaller than the threshold and rejecting the PAN field if the bit error count is not smaller than the threshold.

13. A method for processing a piggybacked acknowledgement/non-acknowledgement (PAN) field, the method comprising:
   receiving a data block including coded bits of a PAN field and a PAN check sequence (PCS);
   decoding the coded bits to obtain the PAN field and the PCS;
   combining the PAN field with a temporary flow identity (TFI); and
   performing a PCS check with the PCS and the combined PAN field and TFI.

14. An apparatus for indicating a temporary block flow (TBF) to which a piggybacked acknowledgement/non-acknowledgement (PAN) field is addressed, the apparatus comprising:
   a PAN check sequence (PCS) generator for processing the PAN field to generate a PCS;
   a forward error correction (FEC) encoder for encoding the PAN field and the PCS to generate coded bits;
   a scrambler for scrambling the coded bits with a TBF-specific scrambling code; and
   a transceiver for sending a data block including the scrambled coded bits.

15. An apparatus for indicating a temporary block flow (TBF) to which a piggybacked acknowledgement/non-acknowledgement (PAN) field is addressed, the apparatus comprising:
   a PAN check sequence (PCS) generator for processing the PAN field to generate a PCS;
   a scrambler for scrambling the PAN field and the PCS with a TBF-specific scrambling code;

a forward error correction (FEC) encoder for encoding the scrambled PAN field and PCS to generate coded bits; and a transceiver for sending a data block including the coded bits.

16. An apparatus for indicating a temporary block flow (TBF) to which a piggybacked acknowledgement/non-acknowledgement (PAN) field is addressed, the apparatus comprising:

a PAN check sequence (PCS) generator for processing the PAN field and a temporary flow identity (TFI) to generate a PCS;

a forward error correction (FEC) encoder for encoding the PAN field and the PCS to generate coded bits; and a transceiver for sending a data block including the coded bits.

17. An apparatus for processing a piggybacked acknowledgement/non-acknowledgement (PAN) field, the apparatus comprising:

a transceiver for receiving a data block including coded bits of a PAN field and a PAN check sequence (PCS);

a decoder for decoding the coded bits of the PAN field and the PCS;

a PCS decoder for performing a PCS check with the PAN field and the PCS; and a comparator for performing a soft metric test by comparing a soft metric computed during the decoding of the coded bits with a threshold, wherein the PAN field is accepted on a condition that both the PCS check and the soft metric test pass.

18. The apparatus of claim 17 wherein the soft metric is a best survivor path metric in Viterbi-type forward error correction decoding.

19. The apparatus of claim 17 wherein the soft metric is a difference between a best survivor path metric and a second best survivor path metric in Viterbi-type forward error correction decoding.

20. The apparatus of claim 17 further comprising:

a bit error counter for counting a number of bit errors; and a comparator for comparing the number of bit errors with a threshold, wherein the PAN field is accepted if the number of bit errors is smaller than the threshold and rejected if the number of bit errors is not smaller than the threshold.

21. An apparatus for processing a piggybacked acknowledgement/non-acknowledgement (PAN) field, the apparatus comprising:

a transceiver for receiving a data block including coded bits of scrambled PAN field and PAN check sequence (PCS);

a decoder for decoding the coded bits to obtain scrambled PAN field and PCS;

a descrambler for descrambling the scrambled PAN field and PCS with a temporary block flow (TBF)-specific scrambling code; and a PCS decoder for performing a PCS check with the PAN field and the PCS.

22. The apparatus of claim 21 further comprising:

a comparator for comparing a soft metric computed during the decoding of the coded bits with a threshold, wherein the PAN field is accepted based on a comparison result.

23. The apparatus of claim 22 wherein the soft metric is a best survivor path metric in Viterbi-type forward error correction decoding.

24. The apparatus of claim 22 wherein the soft metric is a difference between a best survivor path metric and a second best survivor path metric in Viterbi-type forward error correction decoding.

25. The apparatus of claim 21 further comprising:

a bit error counter for counting a number of bit errors; and a comparator for comparing the number of bit errors with a threshold, wherein the PAN field is accepted if the number of bit errors is smaller than the threshold and rejected if the number of bit errors is not smaller than the threshold.

26. An apparatus for processing a piggybacked acknowledgement/non-acknowledgement (PAN) field, the apparatus comprising:

a transceiver for receiving a data block including coded bits of a PAN field and a PAN check sequence (PCS);

a decoder for decoding the coded bits to obtain the PAN field and the PCS; and a PCS decoder for performing a PCS check with the PCS and a combined PAN field and a temporary flow identity (TFI).

27. A method for processing a piggybacked acknowledgement/non-acknowledgement (PAN) field, the method comprising:

receiving a data block including coded bits of a PAN field and a PAN check sequence (PCS);

decoding the coded bits to obtain the PAN field and the PCS;

comparing a soft metric obtained during the decoding of the coded bits with a threshold; and performing a PCS check with the PAN field and the PCS if the PAN field is acceptable based on a comparison result.

28. The method of claim 27 wherein the soft metric is a best survivor path metric in Viterbi-type forward error correction decoding.

29. The method of claim 27 wherein the soft metric is a difference between a best survivor path metric and a second best survivor path metric in Viterbi-type forward error correction decoding.

30. The method of claim 27 wherein the soft metric is a bit error count.

31. An apparatus for processing a piggybacked acknowledgement/non-acknowledgement (PAN) field, the apparatus comprising:

a transceiver for receiving a data block including coded bits of a PAN field and a PAN check sequence (PCS);

a decoder for decoding the coded bits to obtain the PAN field and the PCS;

a comparator for comparing a soft metric obtained during the decoding of the coded bits with a threshold; and a PCS decoder for performing a PCS check with the PAN field and the PCS if the PAN field is acceptable based on a comparison result.

32. The apparatus of claim 31 wherein the soft metric is a best survivor path metric in Viterbi-type forward error correction decoding.

33. The apparatus of claim 31 wherein the soft metric is a difference between a best survivor path metric and a second best survivor path metric in Viterbi-type forward error correction decoding.

34. The apparatus of claim 31 wherein the soft metric is a bit error count.

* * * * *